(12) United States Patent
Fujii

(10) Patent No.: US 10,064,281 B2
(45) Date of Patent: Aug. 28, 2018

(54) CAPACITOR AND CAPACITOR-CONTAINING BOARD

(71) Applicant: Murata Manufacturing Co., Ltd., Nagaokakyo-shi, Kyoto-fu (JP)

(72) Inventor: Yasuo Fujii, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 29 days.

(21) Appl. No.: 15/386,172

(22) Filed: Dec. 21, 2016

(65) Prior Publication Data

US 2017/0181288 A1     Jun. 22, 2017

(30) Foreign Application Priority Data

Dec. 22, 2015   (JP) .................................. 2015-249391

(51) Int. Cl.

| | |
|---|---|
| *H01G 4/30* | (2006.01) |
| *H01G 4/232* | (2006.01) |
| *H05K 1/18* | (2006.01) |
| *H01G 4/005* | (2006.01) |
| *H01G 4/248* | (2006.01) |
| *H01L 23/498* | (2006.01) |

(Continued)

(52) U.S. Cl.
CPC ............. *H05K 1/185* (2013.01); *H01G 2/06* (2013.01); *H01G 4/005* (2013.01); *H01G 4/232* (2013.01); *H01G 4/248* (2013.01); *H01G 4/30* (2013.01); *H01L 23/49822* (2013.01); *H01L 23/49827* (2013.01); *H01L 23/49838* (2013.01); *H01L 24/17* (2013.01); *H05K 1/115* (2013.01); *H05K 1/181* (2013.01); *H01L 2224/16227* (2013.01); *H01L 2224/16235* (2013.01); *H01L 2924/152* (2013.01); *H01L 2924/19041* (2013.01); *H01L 2924/19102* (2013.01); *H05K 2201/10015* (2013.01)

(58) Field of Classification Search
CPC ........ H05K 1/185; H05K 1/115; H05K 1/181; H01G 2/06; H01G 4/005; H01G 4/232; H01G 4/248; H01G 4/30; H01L 23/49822; H01L 23/49827; H01L 23/49838; H01L 24/17; H01L 2224/16227; H01L 2224/16235; H01L 2924/152; H01L 2924/19041; H01L 2924/19102
See application file for complete search history.

(56) References Cited

U.S. PATENT DOCUMENTS

| | | | |
|---|---|---|---|
| 2001/0013602 A1* | 8/2001 | Nakagawa | ........... H01G 13/006 257/4 |
| 2002/0017700 A1 | 2/2002 | Mori et al. | |

(Continued)

FOREIGN PATENT DOCUMENTS

| | | |
|---|---|---|
| JP | 3-48220 U | 5/1991 |
| JP | 2002-025856 A | 1/2002 |

(Continued)

*Primary Examiner* — Dion R Ferguson
(74) *Attorney, Agent, or Firm* — Keating & Bennett, LLP

(57) ABSTRACT

In a capacitor, a width in a length direction of a first portion of a third outer electrode, which is a portion located on a first side surface, is greater than a width in a length direction of a second portion of the third outer electrode, which is a portion located on a first main surface. The first portion of the third outer electrode does not extend to first and second end surfaces.

18 Claims, 5 Drawing Sheets

(51) Int. Cl.
*H01L 23/00* (2006.01)
*H05K 1/11* (2006.01)
*H01G 2/06* (2006.01)

(56) References Cited

U.S. PATENT DOCUMENTS

| | | | | |
|---|---|---|---|---|
| 2003/0011962 A1* | 1/2003 | Yamamoto | ............ | H01G 4/232 |
| | | | | 361/321.2 |
| 2009/0231779 A1* | 9/2009 | Aoki | ............ | H01G 4/005 |
| | | | | 361/301.4 |
| 2012/0320495 A1* | 12/2012 | Akazawa | ............ | H01G 4/30 |
| | | | | 361/321.2 |
| 2014/0029159 A1* | 1/2014 | Shimada | ............ | H01G 4/005 |
| | | | | 361/303 |
| 2017/0345561 A1* | 11/2017 | Asai | ............ | H01G 4/306 |

FOREIGN PATENT DOCUMENTS

| | | |
|---|---|---|
| JP | 2003-022932 A | 1/2003 |
| JP | 2006-100451 A | 4/2006 |

* cited by examiner

CAPACITOR AND CAPACITOR-CONTAINING BOARD

CROSS REFERENCE TO RELATED APPLICATIONS

This application claims the benefit of priority to Japanese Patent Application No. 2015-249391 filed on Dec. 22, 2015. The entire contents of this application are hereby incorporated herein by reference.

BACKGROUND OF THE INVENTION

1. Field of the Invention

The present invention relates to a capacitor and a capacitor-containing board.

2. Description of the Related Art

Hitherto, a so-called three-terminal laminated capacitor has been known, in which first terminal electrodes connected to first inner electrodes are provided on first and second end surfaces, respectively, of a capacitor main body, and second terminal electrodes connected to second inner electrodes are provided on first and second side surfaces, respectively (see, for example, Japanese Unexamined Utility Model Registration Application Publication No. 3-48220.

In the three-terminal laminated capacitor disclosed in Japanese Unexamined Utility Model Registration Application Publication No. 3-48220, the first terminal electrodes extend from the top of the corresponding first or second end surface across the tops of first and second main surfaces and the tops of the first and second side surfaces. The second terminal electrode disposed on the first side surface and the second terminal electrode disposed on the second side surface extend across the first and second main surfaces, respectively, and are electrically connected to each other on the first and second main surfaces. In other words, the second terminal electrode disposed on the first side surface and the second terminal electrode provided on the second side surface are provided as an integrated entity.

The three-terminal laminated capacitor is sometimes connected to an integrated circuit (IC) chip in use, for example. In such cases, there is a desire to reduce equivalent series inductance (ESL) in the three-terminal laminated capacitor in order to reduce source voltage fluctuations in the IC chip.

SUMMARY OF THE INVENTION

Preferred embodiments of the present invention provide a capacitor having low ESL.

A capacitor according to a preferred embodiment of the present invention includes a capacitor main body, a first inner electrode, a second inner electrode, a first outer electrode, a second outer electrode, and a third outer electrode. The capacitor main body includes first and second main surfaces, first and second side surfaces, and first and second end surfaces. The first and second main surfaces extend in a length direction and in a width direction perpendicular or substantially perpendicular to the length direction. The first and second side surfaces extend in the length direction and in a height direction perpendicular or substantially perpendicular to both the length direction and the width direction. The first and second end surfaces extend in the width direction and in the height direction. The first inner electrode is provided within the capacitor main body. The first inner electrode extends out to both the first and second end surfaces. The second inner electrode is provided within the capacitor main body so as to oppose the first inner electrode in the height direction. The second inner electrode extends out to at least the first side surface among the first and second side surfaces. The first outer electrode extends from the top of the first end surface partially across the top of the first main surface. The first outer electrode is connected to the first inner electrode at the first end surface. The second outer electrode extends from the top of the second end surface partially across the top of the first main surface. The second outer electrode is connected to the first inner electrode at the second end surface. The third outer electrode extends from the top of the first side surface partially across the top of the first main surface. The third outer electrode is connected to the second inner electrode at the first side surface. A width in the length direction of a first portion of the third outer electrode that is a portion located on the first side surface is greater than a width in the length direction of a second portion of the third outer electrode that is a portion located on the first main surface. The first portion of the third outer electrode does not extend to the first and second end surfaces.

In a capacitor according to a preferred embodiment of the present invention, the width in the length direction of the first portion of the third outer electrode that is a portion located on the first side surface is greater than the width in the length direction of the second portion of the third outer electrode that is a portion located on the first main surface. The width of the first portion in the length direction is thus able to be increased, which makes it possible to reduce the ESL of the capacitor. Additionally, in the case where, for example, the capacitor is embedded in a board and electrically connected by via hole electrodes, the ESL is able to be reduced without reducing lengths in the length direction of the portions of the first and second outer electrodes located on the first main surface. This makes it possible to achieve both good electrical contact and a low ESL. The via hole electrodes are filled with conductive material.

In a capacitor according to a preferred embodiment of the present invention, the width in the length direction of the first portion of the third outer electrode is preferably no less than approximately twice the width in the length direction of the second portion of the third outer electrode. In this case, the ESL of the capacitor is able to be reduced further.

In a capacitor according to a preferred embodiment of the present invention, preferably, the second inner electrode also extends out to the second side surface, and the capacitor further includes a fourth outer electrode extending from the top of the second side surface partially across the top of the first main surface and connected to the second inner electrode at the second side surface. Preferably, a width in the length direction of a first portion of the fourth outer electrode that is a portion located on the second side surface is greater than a width in the length direction of a second portion of the fourth outer electrode that is a portion located on the first main surface, and the first portion of the fourth outer electrode does not extend to the first and second end surfaces. In this case, the ESL of the capacitor is able to be reduced further.

In a capacitor according to a preferred embodiment of the present invention, the second portion of the third outer electrode and the second portion of the fourth outer electrode are preferably provided as an integrated entity. In this case, the ESL of the capacitor is able to be reduced further.

In a capacitor according to a preferred embodiment of the present invention, the width in the length direction of the first portion of the third outer electrode is preferably longer than approximately twice a distance in the length direction between the second portion of the third outer electrode and a portion of the second outer electrode located on the first main surface. Preferably, this width is longer than approximately twice a distance in the length direction between the second portion of the third outer electrode and a portion of the first outer electrode located on the first main surface. In this case, the ESL of the capacitor is able to be reduced further.

In a capacitor according to a preferred embodiment of the present invention, preferably, the second inner electrode includes an opposing portion opposing the first inner electrode in the height direction and a lead portion extending from the opposing portion to the first side surface, a width of the first portion in the length direction is greater than a width of the lead portion in the length direction, and a portion of the lead portion exposed at the first side surface is covered by the first portion. In this case, the reliability of the capacitor is improved.

In a capacitor according to a preferred embodiment of the present invention, preferably, the second inner electrode includes an opposing portion opposing the first inner electrode in the height direction and a lead portion extending out from the opposing portion to the first side surface, and a width of the lead portion in the length direction is greater than a distance in the length direction between the portion of the first outer electrode located on the first main surface and the portion of the second outer electrode located on the first main surface. In this case, the ESL of the capacitor is able to be reduced further.

In a capacitor according to a preferred embodiment of the present invention, preferably, a length in the length direction of the portion of the first outer electrode located on the first main surface is no less than approximately 0.9 times and no greater than approximately 1.1 times the width in the length direction of the second portion of the third outer electrode, and a length in the length direction of the portion of the second outer electrode located on the first main surface is no less than approximately 0.9 times and no greater than approximately 1.1 times the width in the length direction of the second portion of the third outer electrode, for example.

A capacitor-containing board according to another preferred embodiment of the present invention includes the capacitor according to one of the preferred embodiments of the present invention described above and a board including the capacitor.

A capacitor-containing board according to a preferred embodiment of the present invention may further include an IC chip mounted on the substrate, and the board may include a first via hole electrode electrically connecting the first outer electrode and the IC chip, a second via hole electrode electrically connecting the second outer electrode and the IC chip, and a third via hole electrode electrically connecting the third outer electrode and the IC chip. The capacitor according to various preferred embodiments of the present invention has a low ESL, and thus source voltage fluctuations in the IC chip connected to the capacitor is able to be reduced. Accordingly, the operational stability of the IC chip is improved.

In a capacitor-containing board according to a preferred embodiment of the present invention, preferably, the width of the first portion in the length direction is greater than a distance in the length direction between a center of the first via hole electrode and a center of the third via hole electrode; and the width of the first portion in the length direction is greater than a distance in the length direction between a center of the second via hole electrode and the center of the third via hole electrode. In this case, the ESL of the capacitor is able to be reduced further, and thus source voltage fluctuations in the IC chip is able to be reduced further. As a result, the operational stability of the IC chip is improved further.

According to preferred embodiments of the present invention, a capacitor having a low ESL is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
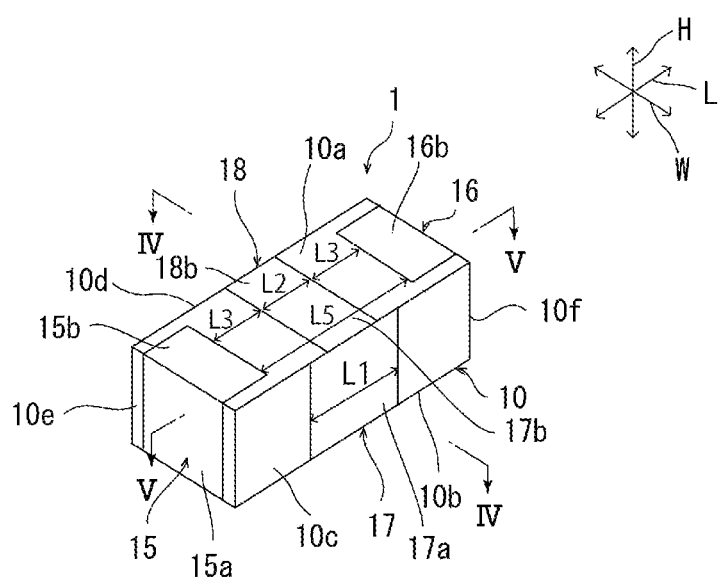
FIG. 1 is a schematic perspective view of a capacitor according to a preferred embodiment of the present invention.

Examples of preferred embodiments of the present invention will be described hereinafter. Note, however, that the following preferred embodiments are merely examples. The present invention is not intended to be limited to the following preferred embodiments in any way.

Furthermore, in the drawings referred to in the description of the preferred embodiments and the like, members having functions that are identical or substantially identical are given identical reference numerals. Moreover, the drawings referred to in the preferred embodiments and the like are schematic depictions. As such, the ratios of dimensions and so on of objects depicted in the drawings may differ from the actual ratios of dimensions and so on of those objects. The ratios of dimensions and so on of the objects may differ from drawing to drawing as well. The specific ratios of dimensions and so on of objects should be determined from the following descriptions.

Figure 2:
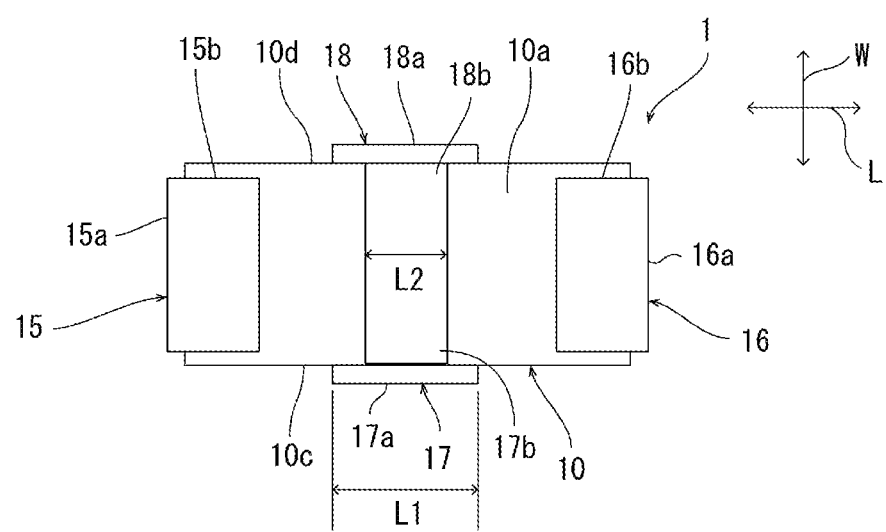
FIG. 2 is a schematic plan view of the capacitor according to a preferred embodiment of the present invention.
Figure 3:
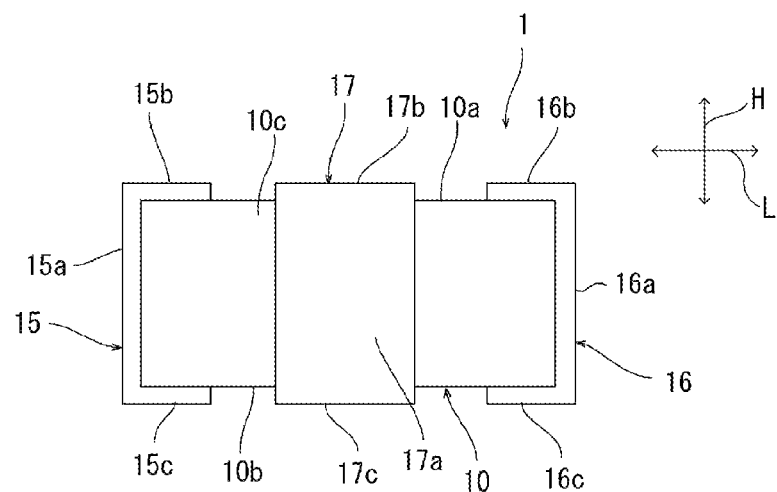
FIG. 3 is a schematic side view of the capacitor according to a preferred embodiment of the present invention.
Figure 4:
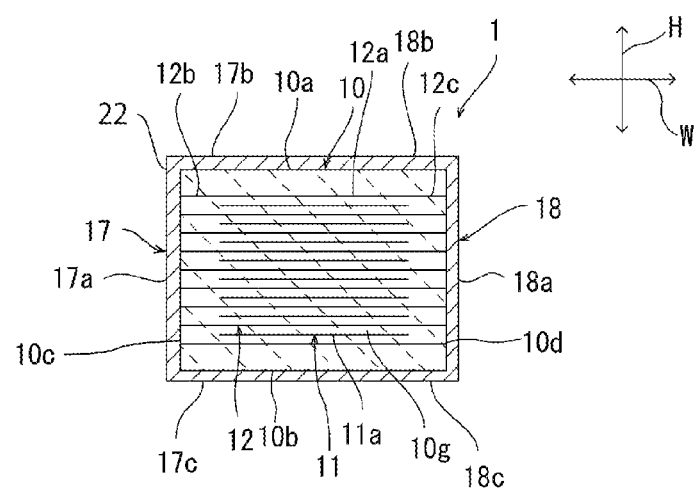
FIG. 4 is a schematic cross-sectional view taken along a line IV-IV in FIG. 1.
Figure 5:
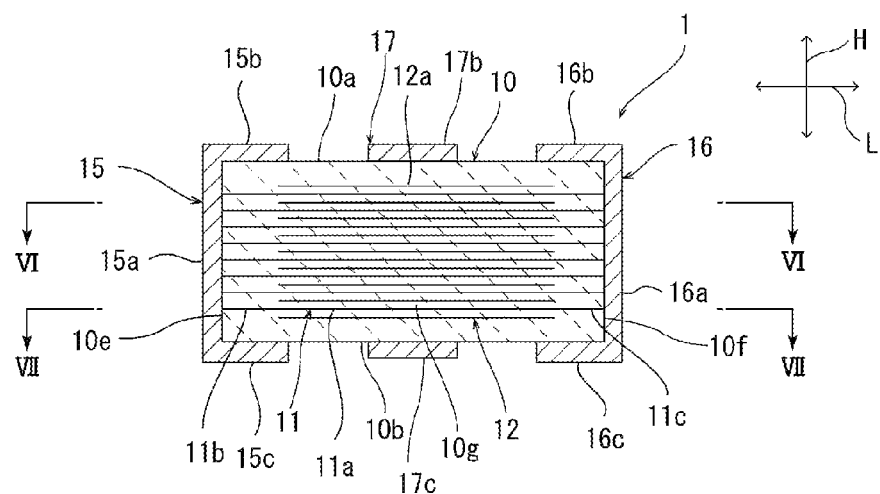
FIG. 5 is a schematic cross-sectional view taken along a line V-V in FIG. 1.
Figure 6:
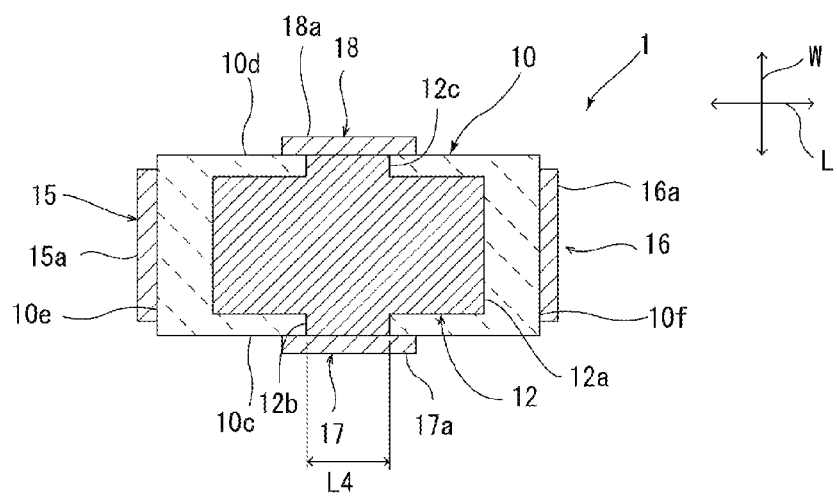
FIG. 6 is a schematic cross-sectional view taken along a line VI-VI in FIG. 5.
Figure 7:
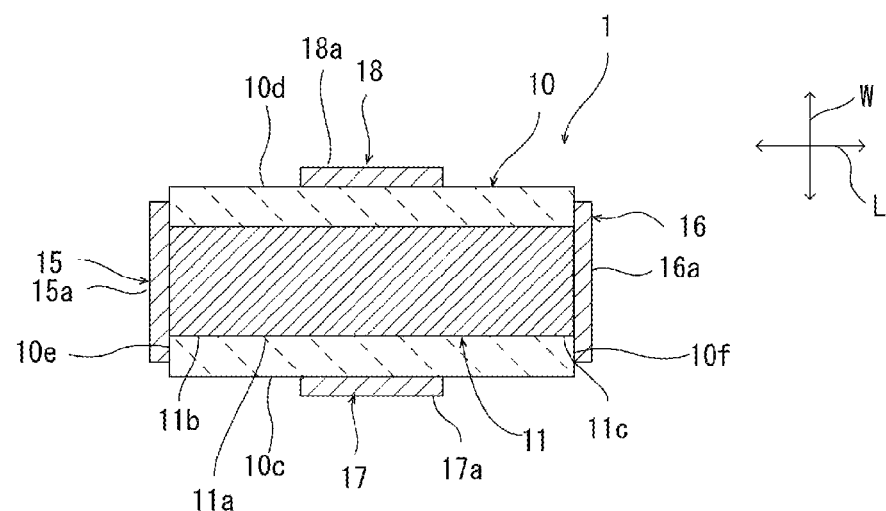
FIG. 7 is a schematic cross-sectional view taken along a line VII-VII in FIG. 5.

FIG. 1 is a schematic perspective view of a capacitor according to the present preferred embodiment. FIG. 2 is a schematic plan view of the capacitor according to the present preferred embodiment. FIG. 3 is a schematic side view of the capacitor according to the present preferred embodiment. FIG. 4 is a schematic cross-sectional view taken along a line IV-IV in FIG. 1. FIG. 5 is a schematic cross-sectional view taken along a line V-V in FIG. 1. FIG. 6 is a schematic cross-sectional view taken along a line VI-VI in FIG. 5. FIG. 7 is a schematic cross-sectional view taken along a line VII-VII in FIG. 5.

As illustrated in FIGS. 1 to 7, a capacitor 1 includes a capacitor main body 10. The capacitor main body 10 preferably has a rectangular parallelepiped or substantially rectangular parallelepiped shape. Corner portions, ridge line portions, and so on of the capacitor main body 10 may be provided having chamfered or substantially chamfered shapes, or having rounded or substantially rounded shapes. Non-planarities may furthermore be provided in main surfaces and in side surfaces.

A dimension of the capacitor main body 10 in a length direction L thereof can be set to greater than or equal to approximately 0.6 mm and less than or equal to approximately 1.6 mm, for example. A dimension of the capacitor main body 10 in a width direction W thereof can be set to greater than or equal to approximately 0.3 mm and less than or equal to approximately 0.8 mm, for example. A dimension of the capacitor main body 10 in a height direction H thereof can be set to greater than or equal to approximately 0.05 mm and less than or equal to approximately 0.3 mm, for example.

The capacitor main body 10 includes first and second main surfaces 10a and 10b, first and second side surfaces 10c and 10d, and first and second end surfaces 10e and 10f.

The first and second main surfaces 10a and 10b each extend along the width direction W and the length direction L. The length direction L is perpendicular or substantially perpendicular to the width direction W. The first main surface 10a and the second main surface 10b oppose each other in the height direction H. The height direction H is perpendicular or substantially perpendicular to both the length direction L and the width direction W.

The first and second side surfaces 10c and 10d each extend along the length direction L and the height direction H. The first side surface 10c and the second side surface 10d oppose each other in the width direction W.

The first and second end surfaces 10e and 10f each extend along the width direction W and the height direction H. The first end surface 10e and the second end surface 10f oppose each other in the length direction L.

The capacitor main body 10 may be a ceramic element made from dielectric ceramics, for example. Hereinafter, the present preferred embodiment will describe an example in which the capacitor main body 10 is preferably made of dielectric ceramics.

$BaTiO_3$, $CaTiO_3$, $SrTiO_3$, $CaZrO_3$, and the like can be given as specific examples of dielectric ceramics. For example, an Mn compound, an Mg compound, a V compound, a Dy compound, an Si compound, an Fe compound, a Cr compound, a Co compound, an Ni compound, a rare earth compound, or the like may be added to the ceramic element.

As illustrated in FIGS. 4 and 5, first inner electrodes 11 and second inner electrodes 12 are provided within the capacitor main body 10. The first inner electrodes 11 and the second inner electrodes 12 oppose each other in the height direction H with a ceramic portion 10g interposed therebetween. Specifically, a plurality of first inner electrodes 11 and a plurality of second inner electrodes 12 are disposed in the capacitor main body 10 along the height direction H in an alternating manner with intervals therebetween. The thickness of the ceramic portion 10g can be set to greater than or equal to approximately 0.5 µm and less than or equal to approximately 2 µm, for example. A distance between the inner electrodes 11 and 12 located closest to the first main surface 10a, and the first main surface 10a, can be set to greater than or equal to approximately 10 µm and less than or equal to approximately 50 µm, for example. A distance between the inner electrodes 11 and 12 located closest to the second main surface 10b, and the second main surface 10b, can be set to greater than or equal to approximately 10 µm and less than or equal to approximately 50 µm, for example.

The first and second inner electrodes 11 and 12 can be made of metals such as Ni, Cu, Ag, Pd, Au, an Ag—Pd alloy, or the like.

The thicknesses of the first and second inner electrodes 11 and 12 can be set to greater than or equal to approximately 0.4 µm and less than or equal to approximately 1 µm, for example.

The number of first and second inner electrodes 11 and 12 can be set to greater than or equal to approximately 50 and less than or equal to approximately 200, for example.

As illustrated in FIGS. 5 and 7, the first inner electrodes 11 extend out to both the first end surface 10e and the second end surface 10f. The first inner electrodes 11 do not extend out to the first and second side surfaces 10c and 10d. The first inner electrodes 11 preferably have rectangular or substantially rectangular shapes extending from the first end surface 10e to the second end surface 10f. Each first inner electrode 11 includes an opposing portion 11a opposing the second inner electrodes 12, with the ceramic portion 10g located therebetween, in the height direction H; a first lead portion 11b, connected to the opposing portion, that extends to the first end surface 10e; and a second lead portion 11c, connected to the opposing portion, that extends to the second end surface 10f.

As illustrated in FIGS. 4 and 6, the second inner electrodes 12 extend out to both the first side surface 10c and the second side surface 10d. Each second inner electrode 12 includes an opposing portion 12a, a first lead portion 12b, and a second lead portion 12c. The opposing portion 12a of the second inner electrode 12 opposes the opposing portions 11a of the first inner electrodes 11, with the ceramic portion 10g located therebetween, in the height direction H. The opposing portion 12a of each second inner electrode 12 is rectangular or substantially rectangular in shape. In each second inner electrode 12, the first lead portion 12b is connected to the opposing portion 12a of the second inner electrode 12 and extends to the first side surface 10c. In each second inner electrode 12, the second lead portion 12c is connected to the opposing portion 12a of the second inner electrode 12 and extends out to the second side surface 10d.

As illustrated in FIGS. 1 to 3, a first outer electrode 15 is provided on the first end surface 10e. The first outer electrode 15 extends from the top of the first end surface 10e partially across the tops of both the first and second main surfaces 10a and 10b. In other words, the first outer electrode 15 includes a first portion 15a located on top of the first end surface 10e, a second portion 15b located on top of the first main surface 10a, and a third portion 15c located on top of the second main surface 10b (see FIGS. 2 and 3). The first outer electrode 15 is connected to the first inner electrodes 11 at the first end surface 10e. The first outer electrode 15 covers portions of the first inner electrodes 11 exposed on the first end surface 10e.

A second outer electrode 16 is provided on the second end surface 10f. The second outer electrode 16 extends from the top of the second end surface 10f partially across the tops of both the first and second main surfaces 10a and 10b. In other words, the second outer electrode 16 includes a first portion 16a located on top of the second end surface 10f (see FIGS. 2 and 3), a second portion 16b located on top of the first main surface 10a, and a third portion 16c located on top of the second main surface 10b. The second outer electrode 16 is connected to the first inner electrodes 11 at the second end surface 10f. The second outer electrode 16 covers portions of the first inner electrodes 11 exposed on the second end surface 10f.

Widths of the second portions 15b and 16b in the width direction W are preferably no less than approximately ¾ of the dimension of the capacitor main body 10 in the width direction W, for example. In this case, the second portions 15b and 16b can be made larger, and thus the bondability of the first outer electrode 15 and the second outer electrode 16 to the capacitor main body 10 is able to be improved. Meanwhile, in the case where, for example, the capacitor 1 is embedded in a board and electrically connected by via hole electrodes or the like, a strong connection between the second portions 15b and 16b and the corresponding via hole electrodes is able to be ensured, which in turn makes it possible to achieve good electrical contact. Likewise, widths of the third portions 15c and 16c in the width direction W are preferably no less than approximately ¾ of the dimension of the capacitor main body 10 in the width direction W, for example.

Meanwhile, widths of the first portions 15a and 16a in the width direction W are preferably no less than approximately ¾ of the dimension of the capacitor main body 10 in the width direction W, for example. In this case, the bondability of the first outer electrode 15 and the second outer electrode 16 to the capacitor main body 10 is able to be improved. In addition, greater dimensions in the width direction W of the first lead portion 11b and the second lead portion 11c can be ensured, which makes it possible to reduce the ESL of the capacitor 1.

The present preferred embodiment is an example in which the first and second outer electrodes 15 and 16 are not provided on the first and second side surfaces 10c and 10d, respectively. However, the present invention is not limited to this configuration. For example, the configuration may be such that the first and second outer electrodes 15 and 16 extend partially across at least one of the first and second side surfaces 10c and 10d, respectively. Ultimately, not providing the first and second outer electrodes 15 and 16 on the first and second side surfaces 10c and 10d, respectively, as in the present preferred embodiment, makes it possible to increase a width, in the length direction L, of portions of third and fourth outer electrodes 17 and 18 (described later) located on the first and second side surfaces 10c and 10d. The ESL of the capacitor 1 is able to be reduced as a result.

As illustrated in FIGS. 1 to 4, the third outer electrode 17 is provided on the first side surface 10c. The third outer electrode 17 extends from the top of the first side surface 10c partially across the tops of both the first and second main surfaces 10a and 10b. In other words, the third outer electrode 17 includes a first portion 17a located on top of the first side surface 10c, a second portion 17b located on top of the first main surface 10a, and a third portion 17c located on top of the second main surface 10b (see FIG. 4). The third outer electrode 17 is connected to the second inner electrodes 12 at the first side surface 10c. The first portion 17a of the third outer electrode 17 covers portions of the second inner electrodes 12 exposed on the first side surface 10c.

In the present preferred embodiment, a length of the second portion 15b in the length direction L, or in other words, a distance, in the length direction L, from an end portion of the second portion 15b on the second end surface 10f side to the first end surface 10e, is preferably no less than approximately 0.9 times and no greater than approximately 1.1 times a length of the second portion 17b in the length direction L, for example. A length of the second portion 16b in the length direction L, or in other words, a distance, in the length direction L, from an end portion of the second portion 16b on the first end surface 10e side to the second end surface 10f, is preferably no less than approximately 0.9 times and no greater than approximately 1.1 times the length of the second portion 17b in the length direction L, for example. This makes it possible to ensure sufficient lengths in the length direction L for the second portion 15b, the second portion 16b, and the second portion 17b, which in turn makes it possible to ensure that the second portion 15b, the second portion 16b, and the second portion 17b are bonded to the first main surface 10a with sufficient strength. Meanwhile, in the case where, for example, the capacitor 1 is embedded in a board and electrically connected by via hole electrodes or the like, a strong connection between the second portions 15b, 16b, and 17b and the corresponding via hole electrodes can be ensured, which in turn makes it possible to achieve good electrical contact.

As illustrated in FIGS. 1 to 4, the fourth outer electrode 18 is provided on the second side surface 10d. The fourth outer electrode 18 extends from the top of the second side surface 10d partially across the tops of both the first and second main surfaces 10a and 10b. In other words, the fourth outer electrode 18 includes a first portion 18a located on top of the first side surface 10c, a second portion 18b located on top of the first main surface 10a, and a third portion 18c located on top of the second main surface 10b (see FIG. 4). The fourth outer electrode 18 is connected to the second inner electrodes 12 at the second side surface 10d. The first portion 18a of the fourth outer electrode 18 covers portions of the second inner electrodes 12 exposed on the second side surface 10d.

Note that in the present preferred embodiment, the second portion 17b of the third outer electrode 17 and the second portion 18b of the fourth outer electrode 18 are preferably provided as an integrated entity. The third portion 17c of the third outer electrode 17 and the third portion 18c of the fourth outer electrode 18 are also preferably provided as an integrated entity. However, the present invention is not limited to this configuration. For example, the second portion 17b and the second portion 18b may be provided as separate entities so as to be separated from each other. The third portion 17c and the third portion 18c may also be provided as separate entities so as to be separated from each other.

The outer electrodes 15 to 18 can be formed from a suitable conductive material. The outer electrodes 15 to 18 can be formed from Cu, Ni, Ti, or the like, for example. Each of the outer electrodes 15 to 18 may be a multilayer body having a plurality of conductive layers, for example.

The first and second outer electrodes 15 and 16 may define signal terminal electrodes and the third and fourth outer electrodes 17 and 18 may define ground terminal electrodes, or vice versa.

Incidentally, from the standpoint of ensuring that the capacitor is reliably connected to interconnects on a mounting board by via hole electrodes (that is, from the standpoint of achieving better contact), it is preferable that the portions of the outer electrodes located on the first or second main surface be made larger. On the other hand, from the standpoint of reducing the ESL of the capacitor, it is preferable that the dimensions of the third and fourth outer electrodes in the length direction be increased in order to shorten current paths. However, if the overall dimensions of the third and fourth outer electrodes in the length direction are increased, it becomes necessary to reduce the dimensions, in the length direction, of the portions of the first and second outer electrodes located on the first and second main surfaces. There are thus cases where it is difficult to ensure reliable conductivity between the capacitor and the interconnects on the mounting board. In other words, there are cases where the capacitor has poorer contact.

In the present preferred embodiment, a dimension L1 of the first portion 17a of the third outer electrode 17 in the length direction L is greater than a dimension L2 of the second and third portions 17b and 17c of the third outer electrode 17 in the length direction L, and furthermore, the first portion 17a does not extend to the first and second end surfaces 10e and 10f, as illustrated in FIGS. 1 and 2. Likewise, a dimension L1 of the first portion 18a of the fourth outer electrode 18 in the length direction L is greater than a dimension L2 of the second and third portions 18b and 18c of the fourth outer electrode 18 in the length direction L, and furthermore, the first portion 18a does not extend to the first and second end surfaces 10e and 10f. Accordingly, the dimensions of the first portions 17a and 18a of the third and fourth outer electrodes 17 and 18 in the length direction L are able to be increased without reducing the dimensions of the second and third portions 15b, 15c, 16b, and 16c of the first and second outer electrodes 15 and 16 in the length direction L. Accordingly, the ESL of the capacitor 1 is able to be reduced while preventing a drop in the quality of contact of the capacitor 1. In addition, greater dimensions in the width direction W of the first lead portion 11b and the second lead portion 11c are able to be ensured, which makes it possible to reduce the ESL of the capacitor 1.

From the standpoint of further reducing the ESL of the capacitor 1, L1 is preferably no less than approximately 1.5 times L2, and further preferably no less than approximately 2 times L2, for example. However, if L1 is too great, there is an increased risk of the first outer electrode 15 or the second outer electrode 16 shorting. Thus L1 is preferably no greater than approximately 4 times L2, and further preferably no greater than approximately 3 times L2, for example.

Additionally, from the standpoint of even further reducing the ESL of the capacitor 1, L1 is preferably greater than approximately 2 times a distance L3 between the second portions 17b and 18b and the second portions 15b and 16b in the length direction L, and further preferably no less than approximately 3 times the distance L3, for example. Preferably, L1 is greater than approximately 2 times a distance L3 between the third portions 17c and 18c and the third portions 15c and 16c in the length direction L, and further preferably no less than approximately 3 times the distance L3, for example. However, if L1 is greater than L3 by too much, there is an increased risk of the first outer electrode 15 or the second outer electrode 16 shorting. Thus L1 is preferably no greater than approximately 6 times L3, and further preferably no greater than approximately 5 times L3, for example.

From the same standpoint, L1 is preferably greater than a distance L5 between the second portion 15b and the second portion 16b in the length direction L (see FIG. 1), and further preferably no less than approximately 1.2 times L5, for example. Preferably, L1 is greater than a distance L5 between the third portion 15c and the third portion 16c in the length direction L, and further preferably no less than approximately 1.2 times L5, for example. However, if L1 is greater than L5 by too much, there is an increased risk of the first outer electrode 15 or the second outer electrode 16 shorting. Thus, L1 is preferably no greater than approximately 1.8 times L5, and further preferably no greater than approximately 1.4 times L5, for example.

From the same standpoint, a width L4 of the lead portions 12b and 12c of the second inner electrodes 12 in the length direction L (see FIG. 6) is preferably no less than approximately L1−300 μm, and further preferably no less than approximately L1−200 μm, for example. However, if L4 is greater than L1 by too much, there is a risk that the second inner electrodes will be exposed from the outer electrodes 17 and 18. Accordingly, L4 is preferably no greater than approximately L1−40 μm, and further preferably no greater than approximately L1−100 μm, for example.

Additionally, L4 is preferably greater than L2. In this case, the ESL of the capacitor 1 is able to be reduced.

A non-limiting example of a method of manufacturing the capacitor 1 is not particularly limited. The capacitor 1 can be manufactured through the following procedure, for example.

First, ceramic green sheets containing a ceramic powder are prepared. The ceramic green sheets can be produced through, for example, the application of a ceramic paste containing a ceramic powder or the like.

Next, a conductive paste layer for forming the first and second inner electrodes 11 and 12 is formed by applying a conductive paste onto one of the ceramic green sheets. The conductive paste can be applied through various types of printing methods such as gravure printing or screen printing, for example.

Next, a plurality of ceramic green sheets to which the conductive paste layer has not been applied are laminated together. On top of these, ceramic green sheets on which are formed conductive paste layers having shapes corresponding to the shapes of the first inner electrodes 11 and ceramic green sheets on which are formed conductive paste layers having shapes corresponding to the shapes of the second inner electrodes 12 are laminated in an alternating manner. Then, a plurality of ceramic green sheets to which the conductive paste layer has not been applied are further laminated thereupon. A multilayer body obtained as a result is then pressed in the thickness direction thereof to produce a mother multilayer body.

Next, a plurality of raw ceramic multilayer bodies are produced from the mother multilayer body by cutting the mother multilayer body along imaginary cut lines. The mother multilayer body can be cut through dicing, press-cutting, or the like, for example.

After the raw ceramic multilayer bodies are produced, ridge line portions of the raw ceramic multilayer bodies may be subjected to chamfering or round chamfering, surface polishing may be carried out, and so on through barrel polishing or the like.

The raw ceramic multilayer body is then fired to produce the capacitor main body 10. The firing temperature can be set as appropriate for the type of ceramic material, conductive paste, and so on that is used.

Next, a conductive paste is applied to the side surfaces 10c and 10d of the capacitor main body 10 using an application roller and then baked, forming the first portions 17a and 18a of the third and fourth outer electrodes 17 and 18.

Next, a conductive paste is applied to the end surfaces 10e and 10f of the capacitor main body 10 using an application roller and then baked, forming the first portions 15a and 16a of the first and second outer electrodes 15 and 16.

Next, the capacitor main body 10 is fixed to a mask tool so that only the portions of the first and second main surfaces 10a and 10b of the capacitor main body 10 where the outer electrodes 15 to 18 are to be formed are exposed. Then, the second portions 15b, 16b, 17b, and 18b and the third portions 15c, 16c, 17c, and 18c of the outer electrodes 15 to 18 are formed through sputtering, chemical vapor deposition (CVD), or the like.

The capacitor main body 10 is then placed in a plating tank and plated so as to complete the outer electrodes 15 to 18.

The capacitor 1 can be completed through the process described above.

Figure 8:
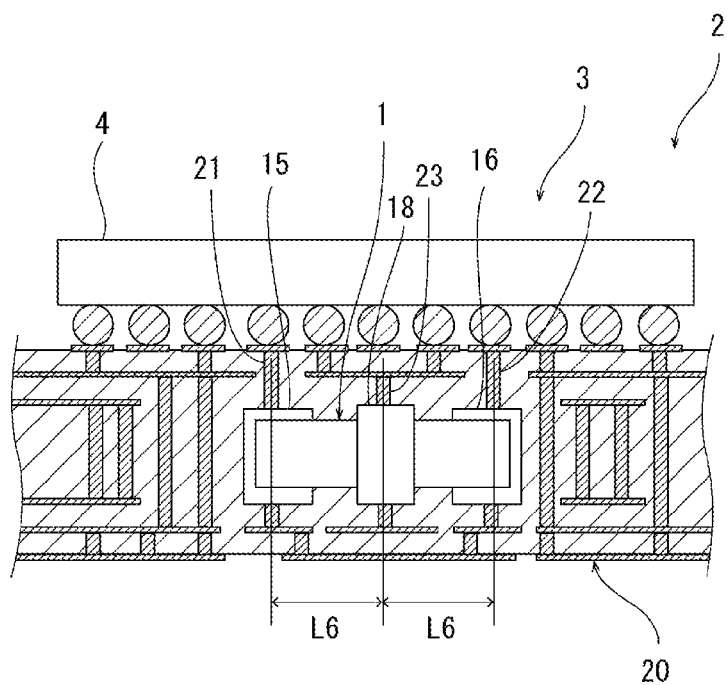
FIG. 8 is a schematic cross-sectional view of a capacitor-containing board according to a preferred embodiment of the present invention.

FIG. 8 is a schematic cross-sectional view of a capacitor-containing board according to a preferred embodiment of the present invention. As illustrated in FIG. 8, a capacitor-containing board 2 includes the capacitor 1 and a board 3. The capacitor 1 is contained within the board 3. An IC chip 4 is mounted on the board 3.

The first outer electrode 15 of the capacitor 1 within the board 3 is electrically connected to the IC chip 4 by first via hole electrodes 21. A plurality of the first via hole electrodes 21 are provided in the width direction with intervals between each other.

The second outer electrode 16 of the capacitor 1 within the board 3 is electrically connected to the IC chip 4 by second via hole electrodes 22. A plurality of the second via hole electrodes 22 are provided in the width direction with intervals between each other.

The third and fourth outer electrodes 17 and 18 of the capacitor 1 within the board 3 are electrically connected to the IC chip 4 by third via hole electrodes 23. A plurality of the third via hole electrodes 23 are provided in the width direction with intervals between each other.

As described above, the dimension L1 is greater than the dimension L2, and the first portion 17a does not extend to the first and second end surfaces 10e and 10f. Accordingly, the second portions 15b, 16b, 17b, and 18b of the outer electrodes 15 to 18, respectively, are able to be made larger, which makes it possible to electrically connect the capacitor 1 and the IC chip 4 in a reliable manner. Additionally, the ESL of the capacitor 1 is able to be reduced, and thus the capacitor 1 is able to function favorably as a decoupling capacitor. Thus, the operations of the IC chip 4 are not easily destabilized even if the load of the IC chip 4 fluctuates.

From the standpoint of further stabilizing the operations of the IC chip 4 in cases where the load of the IC chip 4 fluctuates, L1 (see FIG. 1, for example) is preferably greater than a distance L6 between a center of the third via hole electrode 23 and a center of the first or second via hole electrode 21 or 22 in the length direction, and further preferably no less than approximately 1.2 times L6, for example. However, if L1 is greater than L6 by too much, there is an increased risk of the first outer electrode 15 or the second outer electrode 16 shorting. Thus, L1 is preferably no greater than approximately 2.5 times L6, and further preferably no greater than approximately 1.9 times L6, for example.

First Working Example

A capacitor having substantially the same configuration as the capacitor 1 according to a preferred embodiment of the present invention described above was manufactured through the method described in a preferred embodiment above, under the conditions given below. This capacitor was contained within a board, and the impedance of the contained capacitor was then measured using a network analyzer. The ESL was determined from the measured impedance. The measurement frequency was set to 100 MHz. The results are shown in Table 1 below.

dimension of capacitor main body 10 in length direction L: 1.0 mm dimension of capacitor main body 10 in width direction W: 0.6 mm dimension of capacitor main body 10 in height direction H: 0.2 mm L1: 0.3 mm L2: 0.25 mm L3: 0.15 mm L4: L1–0.2 mm L5: 0.55 mm dimensions of second portions 15b and 16b, third portions 15c and 16c in length direction L: 0.225 mm dimensions of first portions 15a and 16a in width direction W: 0.5 mm distance between first inner electrodes 11 and first or second side surface 10c or 10d: 0.06 mm distance between opposing portions 12a of second inner electrodes 12 and first or second side surface 10c or 10d: 0.06 mm distance between opposing portions 12a of second inner electrodes 12 and first or second end surface 10e or 10f: 0.06 mm composition of capacitor main body: Mg-, V-, Dy-, or Si-added barium titanate thickness of ceramic portion 10g: 1.1 μm distance between inner electrode located closest to main surface and that main surface: 30 μm inner electrodes: Ni total number of inner electrodes: 100 thicknesses of inner electrodes: 0.5 μm firing temperature: 1,200° C.

baking temperature: 900° C.

conductive paste for forming outer electrodes: paste containing Cu and glass second and third portions of outer electrodes:

multilayer body formed 100 nm-thick Ti sputter layer and 600 nm-thick Cu sputter layer, from capacitor main body side outermost layer of outer electrodes: 10 μm-thick Cu plate layer The various dimensions were measured through the procedures described below.

The dimensions of the capacitor main body 10 in the various directions were measured using an optical microscope.

Specifically, for the dimension of the capacitor main body 10 in the length direction L, a sample of the capacitor 1 was manufactured in which the periphery of the capacitor 1 was fixed in resin with the first main surface exposed. Using a grinding machine, the surface of the sample on which the first main surface was exposed was ground down to approximately half the dimension of the width direction W of the capacitors. The ground surface was then processed with ion milling. The dimension of the capacitor main body 10 in the length direction L was then measured at three locations of the ground surface, namely at ¼, ½, and ¾ of the dimension of the capacitor main body 10 in the width direction, and an average of the measured values was determined. This was carried out for 20 samples, and the average of the obtained values was taken as the dimension of the capacitor main body 10 in the length direction L. The dimensions of the capacitor main body 10 in the width direction W and the height direction H were determined using the same method.

L1 was determined by using an optical microscope to measure the maximum dimensions of the first portions 17a and 18a for 20 samples and then calculating an average of the measured values. In the first working example, the dimension of the first portion 17a in the length direction L and the dimension in the length direction L of the first portion 18a were substantially the same.

L2 was determined in the following manner. First, the portion where the second portion 17b and the second portion 18b are provided as an integrated entity was divided into three equal portions in the width direction W, and the maximum dimension in the length direction L of the central region among the three regions obtained by the division was measured using an optical microscope. Likewise, the portion where the third portion 17c and the third portion 18c are provided as an integrated entity was divided into three equal portions in the width direction W, and the maximum dimension in the length direction L of the central region among the three regions obtained by the division was measured using an optical microscope. This was carried out for 20 samples, and an average of the measured values was then determined. In the first working example, the dimension of the portion where the second portion 17b and the second portion 18b are provided as an integrated entity and the dimension of the portion where the third portion 17c and the third portion 18c are provided as an integrated entity were substantially equal.

L3 was determined in the following manner. First, a minimum distance, in the length direction L, between the second portion 15b, and the portion where second portion 17b and the second portion 18b are provided as an integrated entity, was measured using an optical microscope. Likewise, a minimum distance, in the length direction L, between the second portion 16b, and the portion where second portion 17b and the second portion 18b are provided as an integrated entity, was measured using an optical microscope. Furthermore, a minimum distance, in the length direction L, between the third portion 15c, and the portion where third portion 17c and the third portion 18c are provided as an integrated entity, was measured using an optical microscope. Finally, a minimum distance, in the length direction L, between the third portion 16c, and the portion where third portion 17c and the third portion 18c are provided as an integrated entity, was measured using an optical microscope. This was carried out for 20 samples, and an average of the measured values was then determined. In the first working example, the dimension of the portion where the second portion 17b and the second portion 18b are provided as an integrated entity and the dimension of the portion where the third portion 17c and the third portion 18c are provided as an integrated entity were substantially equal.

L4 was determined as follows. For 10 samples, the third and fourth outer electrodes of the capacitor were removed, and the exposed portions of the inner electrodes were measured using an optical microscope. The widths, in the length direction L, of the lead portions 12b and 12c of the second inner electrodes 12 were measured, and an average of those measured values was then determined.

The dimensions of the second portions 15b and 16b and the third portions 15c and 16c in the length direction L were determined as follows. For 20 samples, a maximum dimension of the second portions 15b and 16b and the third portions 15c and 16c in the length direction L was measured using an optical microscope, and an average of the measured values was then determined. In the first working example, the dimension of the second portion 15b in the length direction L, the dimension of the second portion 16b in the length direction L, the dimension of the third portion 15c in the length direction L, and the dimension of the third portion 16c in the length direction L were substantially the same.

Second Working Example

The same capacitor and capacitor-containing board as in the first working example, with the exception of L1 being set to 0.4, were produced, and the ESL was determined. The results are shown in Table 1.

Third Working Example

The same capacitor and capacitor-containing board as in the first working example, with the exception of L1 being set to 0.5, were produced, and the ESL was determined. The results are shown in Table 1.

Fourth Working Example

The same capacitor and capacitor-containing board as in the first working example, with the exception of L1 being set to 0.6, were produced, and the ESL was determined. The results are shown in Table 1.

First Comparative Example

The same capacitor and capacitor-containing board as in the first working example, with the exception of L1 and L2 both being set to 0.25, were produced, and the ESL was determined. The results are shown in Table 1.

Second Comparative Example

The same capacitor and capacitor-containing board as in the first comparative example, with the exception of L1 being set to 0.225, were produced, and the ESL was determined. The results are shown in Table 1.

TABLE 1

|  | Comp. Ex. 1 | Comp. Ex. 2 | First Work. Ex. | Second Work. Ex. | Third Work. Ex. | Fourth Work. Ex. |
| --- | --- | --- | --- | --- | --- | --- |
| L1 (mm) | 0.225 | 0.25 | 0.3 | 0.4 | 0.5 | 0.6 |
| L2 (mm) | 0.25 | 0.25 | 0.25 | 0.25 | 0.25 | 0.25 |
| ESL (pH) | 86.2 | 83.9 | 81.5 | 79.6 | 77.5 | 75.2 |

From Table 1, it can be seen that the ESL of the capacitor is able to be reduced by making L1 greater than L2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A capacitor comprising:
   a capacitor main body including first and second main surfaces extending in a length direction and in a width direction perpendicular or substantially perpendicular to the length direction, first and second side surfaces extending in the length direction and in a height direction perpendicular or substantially perpendicular to both the length direction and the width direction, and first and second end surfaces extending in the width direction and in the height direction;
   a first inner electrode provided within the capacitor main body and extending to both the first and second end surfaces;

a second inner electrode, provided within the capacitor main body so as to oppose the first inner electrode in the height direction, and extending out to at least the first side surface among the first and second side surfaces;

a first outer electrode, extending from a top of the first end surface partially across a top of the first main surface, connected to the first inner electrode at the first end surface;

a second outer electrode, extending from a top of the second end surface partially across the top of the first main surface, connected to the first inner electrode at the second end surface; and a third outer electrode, extending from a top of the first side surface partially across the top of the first main surface, connected to the second inner electrode at the first side surface; wherein a width in the length direction of a first portion of the third outer electrode that is a portion located on the first side surface is greater than a width in the length direction of a second portion of the third outer electrode that is a portion located on the first main surface; and the first portion of the third outer electrode does not extend to the first and second end surfaces.

2. The capacitor according to claim 1, wherein the width in the length direction of the first portion of the third outer electrode is not less than about twice a width in the length direction of the second portion of the third outer electrode.

3. The capacitor according to claim 1, wherein the second inner electrode extends out to the second side surface;

the capacitor further comprises a fourth outer electrode, extending from a top of the second side surface partially across the top of the first main surface, connected to the second inner electrode at the second side surface; and a width in the length direction of a first portion of the fourth outer electrode that is a portion located on the second side surface is greater than a width in the length direction of a second portion of the fourth outer electrode that is a portion located on the first main surface; and the first portion of the fourth outer electrode does not extend to the first and second end surfaces.

4. The capacitor according to claim 3, wherein the second portion of the third outer electrode and the second portion of the fourth outer electrode define an integrated structural entity.

5. The capacitor according to claim 1, wherein the width in the length direction of the first portion of the third outer electrode is longer than about twice a distance in the length direction between the second portion of the third outer electrode and a portion of the second outer electrode located on the first main surface; and the width in the length direction of the first portion of the third outer electrode is longer than about twice a distance in the length direction between the second portion of the third outer electrode and a portion of the first outer electrode located on the first main surface.

6. The capacitor according to claim 1, wherein the second inner electrode includes an opposing portion opposing the first inner electrode in the height direction and a lead portion extending out from the opposing portion to the first side surface; and a width of the first portion in the length direction is greater than a width of the lead portion in the length direction, and a portion of the lead portion exposed at the first side surface is covered by the first portion.

7. The capacitor according to claim 1, wherein the second inner electrode includes an opposing portion opposing the first inner electrode in the height direction and a lead portion extending out from the opposing portion to the first side surface; and a width of the lead portion in the length direction is greater than a distance in the length direction between a portion of the first outer electrode located on the first main surface and a portion of the second outer electrode located on the first main surface.

8. The capacitor according to claim 1, wherein a length in the length direction of a portion of the first outer electrode located on the first main surface is not less than about 0.9 times and no greater than about 1.1 times a width in the length direction of the second portion of the third outer electrode; and a length in the length direction of a portion of the second outer electrode located on the first main surface is not less than about 0.9 times and no greater than about 1.1 times a width in the length direction of the second portion of the third outer electrode.

9. A capacitor-containing board comprising:

the capacitor according to claim 1; and a board including the capacitor.

10. The capacitor-containing board according to claim 9, further comprising:

an IC chip mounted on the substrate; wherein the board includes:

a first via hole electrode electrically connecting the first outer electrode and the IC chip;

a second via hole electrode electrically connecting the second outer electrode and the IC chip; and a third via hole electrode electrically connecting the third outer electrode and the IC chip.

11. The capacitor-containing board according to claim 10, wherein the width of the first portion in the length direction is greater than a distance in the length direction between a center of the first via hole electrode and a center of the third via hole electrode; and the width of the first portion in the length direction is greater than a distance in the length direction between a center of the second via hole electrode and the center of the third via hole electrode.

12. The capacitor-containing board according to claim 9, wherein the width in the length direction of the first portion of the third outer electrode is not less than about twice a width in the length direction of the second portion of the third outer electrode.

13. The capacitor-containing board according to claim 9, wherein the second inner electrode extends out to the second side surface;

the capacitor further comprises a fourth outer electrode, extending from a top of the second side surface partially across the top of the first main surface, connected to the second inner electrode at the second side surface; and a width in the length direction of a first portion of the fourth outer electrode that is a portion located on the second side surface is greater than a width in the length direction of a second portion of the fourth outer electrode that is a portion located on the first main surface; and the first portion of the fourth outer electrode does not extend to the first and second end surfaces.

14. The capacitor-containing board according to claim 13, wherein the second portion of the third outer electrode and the second portion of the fourth outer electrode define an integrated structural entity.

15. The capacitor-containing board according to claim 9, wherein
the width in the length direction of the first portion of the third outer electrode is longer than about twice a distance in the length direction between the second portion of the third outer electrode and a portion of the second outer electrode located on the first main surface; and
the width in the length direction of the first portion of the third outer electrode is longer than about twice a distance in the length direction between the second portion of the third outer electrode and a portion of the first outer electrode located on the first main surface.

16. The capacitor-containing board according to claim 9, wherein
the second inner electrode includes an opposing portion opposing the first inner electrode in the height direction and a lead portion extending out from the opposing portion to the first side surface; and
a width of the first portion in the length direction is greater than a width of the lead portion in the length direction, and a portion of the lead portion exposed at the first side surface is covered by the first portion.

17. The capacitor-containing board according to claim 9, wherein
the second inner electrode includes an opposing portion opposing the first inner electrode in the height direction and a lead portion extending out from the opposing portion to the first side surface; and
a width of the lead portion in the length direction is greater than a distance in the length direction between a portion of the first outer electrode located on the first main surface and a portion of the second outer electrode located on the first main surface.

18. The capacitor-containing board according to claim 9, wherein
a length in the length direction of a portion of the first outer electrode located on the first main surface is not less than about 0.9 times and no greater than about 1.1 times a width in the length direction of the second portion of the third outer electrode; and
a length in the length direction of a portion of the second outer electrode located on the first main surface is not less than about 0.9 times and no greater than about 1.1 times a width in the length direction of the second portion of the third outer electrode.

* * * * *